United States Patent [19]
Sakuno

[11] Patent Number: 6,121,841
[45] Date of Patent: Sep. 19, 2000

[54] TRANSISTOR POWER AMPLIFIER FOR PORTABLE TERMINALS FOR MOBILE COMMUNICATIONS

[75] Inventor: Keiichi Sakuno, Nara, Japan

[73] Assignee: Sharp Kabushiki Kaisha, Osaka, Japan

[21] Appl. No.: 08/917,870

[22] Filed: Aug. 27, 1997

[30] Foreign Application Priority Data

Aug. 30, 1996 [JP] Japan .................... 8-229865

[51] Int. Cl.[7] .............. H03G 3/30; H03F 3/191

[52] U.S. Cl. ..................... 330/285; 330/302

[58] Field of Search ................... 330/136, 285, 330/296, 302

[56] References Cited

U.S. PATENT DOCUMENTS 5,023,569   6/1991   Raven ........................ 330/285

FOREIGN PATENT DOCUMENTS 0047715   4/1980   Japan ........................ 330/285

Primary Examiner—Steven J. Mottola

[57] ABSTRACT

In a transistor power amplifier, a base of a power amplifying bipolar transistor is connected with a gain control power source via a bias resistor. The power amplifying transistor is directly biased from the gain control power source via the bias resistor, and not via a base driving bipolar transistor so as to widen an effective gain control voltage range by an amount corresponding to an ON-state voltage across a base and emitter of the base driving bipolar transistor.

12 Claims, 8 Drawing Sheets

TRANSISTOR POWER AMPLIFIER FOR PORTABLE TERMINALS FOR MOBILE COMMUNICATIONS

BACKGROUND OF THE INVENTION

1. Field of the Invention

The present invention relates to a transistor power amplifier employing a bipolar transistor.

2. Description of the Background Art

In recent years, energetic research and development has been carried out to reduce the size and weight of mobile communications portable remote terminals represented by cellular phones.

If such a terminal is constructed entirely of active components which operate on a single positive power source, neither a negative power source nor a negative voltage generator circuit is necessary, which contributes to the reduction in size and weight of the terminal. Accordingly, for a transmission use power amplifier device, silicon NPN-type bipolar transistors and gallium arsenide compound semiconductor hetero-junction bipolar transistors (referred to as "GaAs HBTs" hereinafter) capable of operating on a single positive power source are attracting attention as promising devices.

In particular, the GaAs HBT has an excellent high-frequency characteristic in a low collector voltage operation stage in comparison with the silicon bipolar transistor. Therefore, the GaAs HBT is expected as an important device which proves its merits when the power voltage of the portable remote terminal is reduced as a result of reducing in number the batteries for the reduction in size and weight of the portable remote terminal.

FIG. 7 shows a circuit diagram of a prior art common-emitter type power amplifier employing a bipolar transistor. In the figure are shown a power amplifying bipolar tragnsistor TR1 and a base driving bipolar transistor Tr2 for the power amplifying bipolar transistor Tr1. Vcc denotes a collector power source for the power amplifying bipolar transistor (referred to simply as "power amplifying transistor" hereinafter) Tr1 and the base driving bipolar transistor (referred to simply as "base driving transistor" hereinafter) Tr2, Vbb denotes a gain control power source for controlling the gain of the present power amplifier, and R1 and R2 denote base voltage adjusting bias resistors for the base driving transistor Tr2. A signal Pin at a signal input terminal is supplied to the base of the power amplifying transistor Tr1 via an input matching circuit 1 and outputted as a signal Pout from the collector of the power amplifying transistor Tr1 via an output matching circuit (including a collector bias circuit) 3.

The base driving transistor Tr2 is generally employed for the purpose of reducing a gain control current Ibb to be supplied from the gain control power source Vbb by substantially supplying the base current of the power amplifying transistor TR1 from the collector power source Vcc such that an external control circuit for generating the gain control voltage Vbb is required to have a reduced current supply ability. It is to be noted that the quantity of reduction of the gain control current Ibb to be supplied from the gain control power source Vbb achieved by virtue of the base driving transistor Tr2 is approximately inversely proportional to the current amplification factor of the base driving transistor Tr2. Since the current amplification factor of a transistor is normally ten or greater, the current can be reduced to at least one tenth of that in the case where the base driving transistor Tr2 is not incorporated.

For example, a GSM (Global System for Mobile Communications) digital cellular phone portable remote terminal is required to yield an antenna terminal transmission output of two watts, and the transmission use power amplifier is required to yield an output of about three watts. In this case, assuming that the collector power voltage Vcc is 4.8 V and the power-added efficiency is 50%, then the average collector current of the power amplifying transistor TR1 is 1.25 A. Then, assuming that the current amplification factor of the power amplifying transistor TR1 is ten, a base current of 125 mA is necessary for flowing an average collector current of 1.25 A. Since the gain control current Ibb can be reduced to one tenth by employing the base driving transistor Tr2 as described above, the gain control current Ibb is allowed to be 12.5 mA.

In the power amplifier constructed as above, by varying the gain control voltage Vbb, the bias point of the power amplifying transistor TR1 and hence the gain of the power amplifying transistor Tr1 are changed for controlling the gain of the power amplifier.

Furthermore, by amplifying by the power amplifying transistor TR1 an alternating variation due to the input signal Pin of the base potential of the power amplifying transistor TR1 and of a current injected to the base of the power amplifying transistor Tr1, the input signal Pin is amplified.

However, in the above prior art power amplifier, the following problems occur due to the existence of the ON-state voltage of about 0.7 V in the case of the silicon bipolar transistor or the ON-state voltage of about 1.3 V in the case of the GaAs HBT across the base and the emitter of the bipolar transistor.

(1) First Problem

FIG. 8 shows a relation between the collector current Icc and the gain control power voltage Vbb in the prior art power amplifier shown in FIG. 7.

Assuming now that the ON-state voltage across the base and the emitter of the bipolar transistor is Vbi, then the ON-state voltage of the power amplifying transistor Tr1 viewed from the base terminal of the base driving transistor Tr2 is the sum 2Vbi of the ON-state voltage Vbi of the power amplifying transistor Tr1 and the ON-state voltage Vbi of the base driving transistor Tr2. Therefore, with the voltage drop ΔVbb of the bias resistor R1 added to the sum 2Vbi, the ON-state voltage Vbb_on of the power amplifying transistor TR1 viewed from the terminal of the gain control power source Vbb (referred to as "amplifier ON-state voltage" hereinafter) is:

$$Vbb\_on = 2Vbi + \Delta Vbb$$

Neither one of the transistors TR1 and Tr2 is turned on until the amplifier ON-state voltage Vbb_on is achieved. Accordingly, assuming that the maximum value of the gain control voltage Vbb is Vbb_max, then the effective voltage (effective gain control voltage) Vbbw capable of controlling the gain is:

$$Vbbw = Vbb\_max - Vbb\_on$$
$$= Vbb\_max - (2Vbi + \Delta Vbb)$$

Currently, the mainstream power voltage of the digital cellular phone portable remote terminal such as GSM is 4.8 V provided by a series connection of four cells of a nickel-hydrogen battery. Therefore, supposing that the maximum gain control voltage Vbb_max is allowed to have an upper limit of 4.8 V and the voltage drop ΔVbb due to the bias resistor R1 is ignored, since the ON-state voltage of the silicon bipolar transistor is 0.7 V and the ON-state voltage of the GaAs HBT is 1.3 V as described above, then the maximum value of the effective gain control voltage Vbbw is Vbbw=3.4 V in the case of the silicon bipolar transistor and Vbbw=2.2 V in the case of the GaAs HBT.

For the purpose of further reducing the size and weight of the portable remote terminal, the battery is also required to be reduced in size and weight, and it is desired to shift the power voltage to 3.6 V provided by a series connection of three cells of the nickel-hydrogen battery or by one cell of a lithium ion battery.

However, in the case where the battery power voltage is set to 3.6 V, even when the maximum gain control voltage Vbb__max is allowed to have an upper limit of 3.6 V and the voltage drop ΔVbb due to the bias resistor R1 is ignored, the maximum value of the effective gain control voltage Vbbw is Vbbw=2.2 V in the case of the silicon bipolar transistor and Vbb=1.0 V in the case of the GaAs HBT. That is, in contrast to the rate of reduction of the power voltage from 4.8 V to 3.6 V being 75%, the rate of reduction of Vbbw is 65% in the case of the silicon bipolar transistor and 45% in the case of the GaAs HBT. This means that the effective gain control voltage is reduced to a further degree than the power voltage is, and consequently the effective gain control voltage has an extremely narrowed range.

Therefore, when the power voltage is set to 3.6 V, dependence of the gain on the gain control power voltage Vbb in the power amplifier becomes steep, causing the problem of an increased difficulty in executing precise gain control.

In practice, the voltage drop ΔVbb due to the bias resistor R1 cannot be ignored, and the maximum gain control voltage Vbb__max is reduced by the voltage drop ΔVbb. Furthermore, since the ON-state voltage Vbi across the base and the emitter is high particularly in the case of the GaAs HBT, a great influence is imposed on the reduction of the maximum gain control voltage Vbb__max, meaning that the problem is more serious.

In a frequency range equal to or higher than the quasi-microwave (equal to or higher than 800 MHz) used for mobile communications, the GaAs HBT has a high power-added efficiency in the low voltage operation stage in comparison with that of the silicon bipolar transistor and contributes much to the reduction of consumption current of the terminal and the prolongation of the time for communications. Therefore, it is very meaningful to solve the above problem.

(2) Second Problem

As described above, in the power amplifier having the construction shown in FIG. 7, the alternating variation due to the input signal Pin of the base potential of the power amplifying transistor TR1 and the current injected to the base of the power amplifying transistor TR1 is amplified by the power amplifying transistor Tr1, so that the input signal Pin is amplified.

If the voltage across the base and the emitter of the power amplifying transistor Tr1 is increased by the input signal Pin, the voltage across the base and the emitter of the base driving transistor Tr2 is reduced since the base of the power amplifying transistor TR1 and the emitter of the base driving transistor Tr2 are at an identical electric potential when viewed from the base driving transistor Tr2. As a result, the ability of the base driving transistor Tr2 for driving the base of the power amplifying transistor Tr1 is reduced. Consequently, the ON-state voltage existing across the base and the emitter of the power amplifying transistor TR1 partially cancels the driving of the power amplifying transistor Tr1 by the input signal Pin.

That is, the ON-state voltage existing across the base and the emitter of the power amplifying transistor Tr1 suppresses the peak value or the amplitude of the current injected to the base, and this becomes a factor of causing a gain reduction or output reduction of the power amplifying transistor Tr1.

The power amplifier has the following operating modes:
class A and class AB: Vbb>Vbb__on,
class B: Vbb=Vbb__on, and
class C: Vbb<Vbb__on,
where
Vbb: gain control voltage, and
Vbb__on: amplifier ON-state voltage.

As is obvious, as the operating mode comes closer to the class C as a consequence of the reduction of the gain control voltage Vbb, the period during which the power amplifying transistor Tr1 is in an off state in one cycle of the input signal Pin in the signal input stage becomes longer. Therefore, in order to consistently obtain the same output power, it is required to increase the peak current to be flowed into the base of the power amplifying transistor TR1 accordingly as the operating mode comes closer to the class C as a consequence of the reduction of the gain control voltage Vbb.

That is, a base current amplitude suppressing effect attributed to the ON-state voltage existing across the base and the emitter of the power amplifying transistor Tr1 becomes a serious problem as the operating mode comes closer to the class C.

As described above, it is the mainstream practice that the power voltage of the digital cellular phone portable remote terminal such as GSM is 4.8 V provided by a series connection of four cells of the nickel-hydrogen battery. However, due to a voltage drop in the gain control circuit comprised of the base driving transistor Tr2 and so forth, the maximum gain control voltage Vbb__max is generally reduced to about 3.5 V.

If the voltage drop ΔVbb of the bias resistor R1 is ignored since it can be adjusted by the division ratio of the bias resistor R1 to the bias resistor R2, according to the fact that the ON-state voltage Vbi of the silicon bipolar transistor is 0.7 V and the ON-state voltage Vbi of the GaAs HBT is 1.3 V as described above, and from the following equation:

$$Vbb\_on = 2Vbi + \Delta Vbb,$$

the amplifier ON-state voltage Vbb__on is 1.4 V in the case of the silicon bipolar transistor and 2.6 V in the case of the GaAs HBT. Accordingly, when either one of the bipolar transistors is used, the ON-state voltage is lower than the maximum gain control voltage Vbb__max of 3.5 V for the case where 4.8 V is adopted as the above battery power voltage. This means that the power amplifying transistor TR1 can be operated either as a class A amplifier or at least as a class AB amplifier when 4.8 V is used as the battery power voltage.

However, when the battery power voltage is made to be 3.6 V provided by a series connection of three cells of the nickel-hydrogen battery or by one cell of the lithium ion battery for the purpose of reducing the size and weight of the portable remote terminal, the maximum gain control voltage Vbb__max is reduced to as low as about 2.2 V due to the voltage drop in the gain control circuit.

In this case, when the GaAs HBT is used as the transistor, the maximum gain control voltage Vbb__max of 2.2 V is lower than the amplifier ON-state voltage Vbb_on of 2.6 V, so that the power amplifying transistor TR1 enters into the class C operation, disadvantageously reducing the gain and the output of the power amplifier. Furthermore, when a limitation is imposed on the level of the input signal, the gain reduction causes an output reduction, making the problem more serious.

When the silicon bipolar transistor is used as the transistor, the above problem is less serious since the amplifier ON-state voltage Vbb_on is lower than when the GaAs HBT is used. However, when the battery power voltage is further reduced, the above problem becomes serious similarly to the case of the GaAs HBT.

In the frequency region not lower than the quasi-microwave (not lower than 800 MHz) used for mobile communications, the GaAs HBT has a high power-added efficiency in the low voltage operation stage in comparison with that of the silicon bipolar transistor and contributes much to the reduction of consumption current of the terminal and the prolongation of the time for communications. Therefore, it is very meaningful to solve the above problem, thereby allowing the GaAs HBT to be used as a power amplifier.

SUMMARY OF THE INVENTION

The object of the present invention is therefore to provide a transistor power amplifier which has a wide effective gain control voltage range as well as a high gain and a high output voltage even in the low voltage operation stage.

In order to accomplish the above object, a transistor power amplifier according to a first aspect of the present invention includes:

a first transistor which is constructed of a bipolar transistor and which has an emitter grounded and a collector connected with a collector drive power source for amplifying a signal supplied to a base thereof to output the amplified signal from the collector;

a second transistor which is constructed of a bipolar transistor and which has an emitter connected with the base of the first transistor, a collector connected with a collector drive power source, and a base connected with a gain control power source; and a resistor connected with the gain control power source and the base of the first transistor.

According to the above construction, the first transistor is directly biased by the gain control power source via the resistor connected with the gain control power source and the base of the first transistor, and not via the second transistor, until the second transistor whose base is connected to the gain control power source is turned on. Thus, the effective gain control voltage range provided by the gain control power source is widened by an amount corresponding to the ON-state voltage across the base and the emitter of the second transistor, as compared with the effective gain control voltage range obtained in the case where the first transistor is biased only via the second transistor.

The gain control power source may have a voltage that is equal to or smaller than a sum of an ON-state voltage across the base and the emitter of the first transistor and an ON-state voltage across the base and the emitter of the second transistor.

The effective gain control voltage range provided by the gain control power source is widened by an amount corresponding to the ON-state voltage across the base and the emitter of the second transistor in the present invention, as described above. Therefore, even though the voltage of the gain control power source is equal to or smaller than a sum of the ON-state voltage across the base and the emitter of the first transistor and the ON-state voltage across the base and the emitter of the second transistor, the bias point of the first transistor is shifted by the gain control power source, so that the gain is controllable.

A transistor power amplifier according to a second aspect of the present invention includes:

a first transistor which is constructed of a bipolar transistor and which has an emitter grounded and a collector connected with a collector drive power source for amplifying a signal supplied to a base thereof to output the amplified signal from the collector;

a second transistor which is constructed of a bipolar transistor and which has an emitter connected with the base of the first transistor, a collector connected with a collector drive power source, and a base connected with a gain control power source;

a signal input terminal for supplying a signal to the base of the first transistor; and an impedance circuit for connecting the base of the second transistor with the signal input terminal.

A transistor power amplifier according to a third aspect of the present invention includes:

a first transistor which is constructed of a bipolar transistor and which has an emitter grounded and a collector connected with a collector drive power source for amplifying a signal supplied to a base thereof to output the amplified signal from the collector;

a second transistor which is constructed of a bipolar transistor and which has an emitter connected with the base of the first transistor, a collector connected with a collector drive power source, and a base connected with a gain control power source; and an impedance circuit for connecting the base of the second transistor with the base of the first transistor.

A transistor power amplifier according to a fourth aspect of the present invention includes:

a first transistor which is constructed of a bipolar transistor and which has an emitter grounded, a collector connected with a collector drive power source, and a base connected to an impedance matching circuit for amplifying a signal supplied to the base via the impedance matching circuit to output the amplified signal from the collector;

a second transistor which is constructed of a bipolar transistor and which has an emitter connected with the base of the first transistor, a collector connected with a collector drive power source, and a base connected with a gain control power source; and an impedance circuit for connecting the base of the second transistor with the impedance matching circuit.

According to the construction of the second, third and fourth aspects of the present invention, by adjusting the impedance of the impedance circuit that connects the signal input terminal, the base of the first transistor or the impedance matching circuit with the base of the second transistor, a phase of the AC electric potential at the emitter is made consistent with that of the AC electric potential at the base of the second transistor. Therefore, when the emitter potential of the second transistor is increased by the input signal, the base potential of the second transistor is also increased, so that the reduction of a voltage across the base and the emitter of the second transistor is suppressed.

As a result, the ability of the second transistor to drive the base of the first transistor is prevented from deteriorating, so that the gain reduction is prevented.

It is to be noted that the above effect of the second to fourth aspects of the present invention is obtained regardless of the voltage of the gain control power source and the ON-state voltage of the first transistor viewed from the gain control power source. Therefore, the present invention can sufficiently cope with a low voltage operation stage.

In any one of the above transistor power amplifiers, each bipolar transistor may be a gallium arsenide compound semiconductor hetero-junction bipolar transistor (GaAs HBT).

In this case, the ON-state voltage across the base and the emitter is greater than in the case where a silicon bipolar transistor is used as the bipolar transistor. However, because the effective gain control range is expanded by an amount corresponding to the ON-state voltage across the base and the emitter of the second transistor, the gain control is sufficiently executed. The transistor power amplifier using the GaAs HBTs has an excellent high-frequency characteristic in the low collector voltage operation stage and is able to contribute to the reduction of the battery power voltage. Therefore, according to this invention, the reduction in size and weight of the portable remote terminal for mobile communications or the like will be remarkably promoted.

Furthermore, when the GaAs HBTs are employed as the first and second transistors, the ON-state voltage of the first transistor viewed from the gain control power source terminal is greater than in the case where the silicon bipolar transistor is employed. However, because the reduction of the potential across the base and the emitter of the second transistor due to the input signal is suppressed, the ability of the second transistor to drive the base of the first transistor is compensated regardless of the value of the ON-state voltage. As a result, the reduction of the gain is prevented.

BRIEF DESCRIPTION OF THE DRAWINGS

The present invention will become more fully understood from the detailed description given hereinbelow and the accompanying drawings which are given by way of illustration only,. and thus are not limitative of the present invention, and wherein.

DETAILED DESCRIPTION OF THE PREFERRED EMBODIMENTS

The present invention will be described in detail below by way of preferred embodiments with reference to the accompanying drawings.

Figure 1:
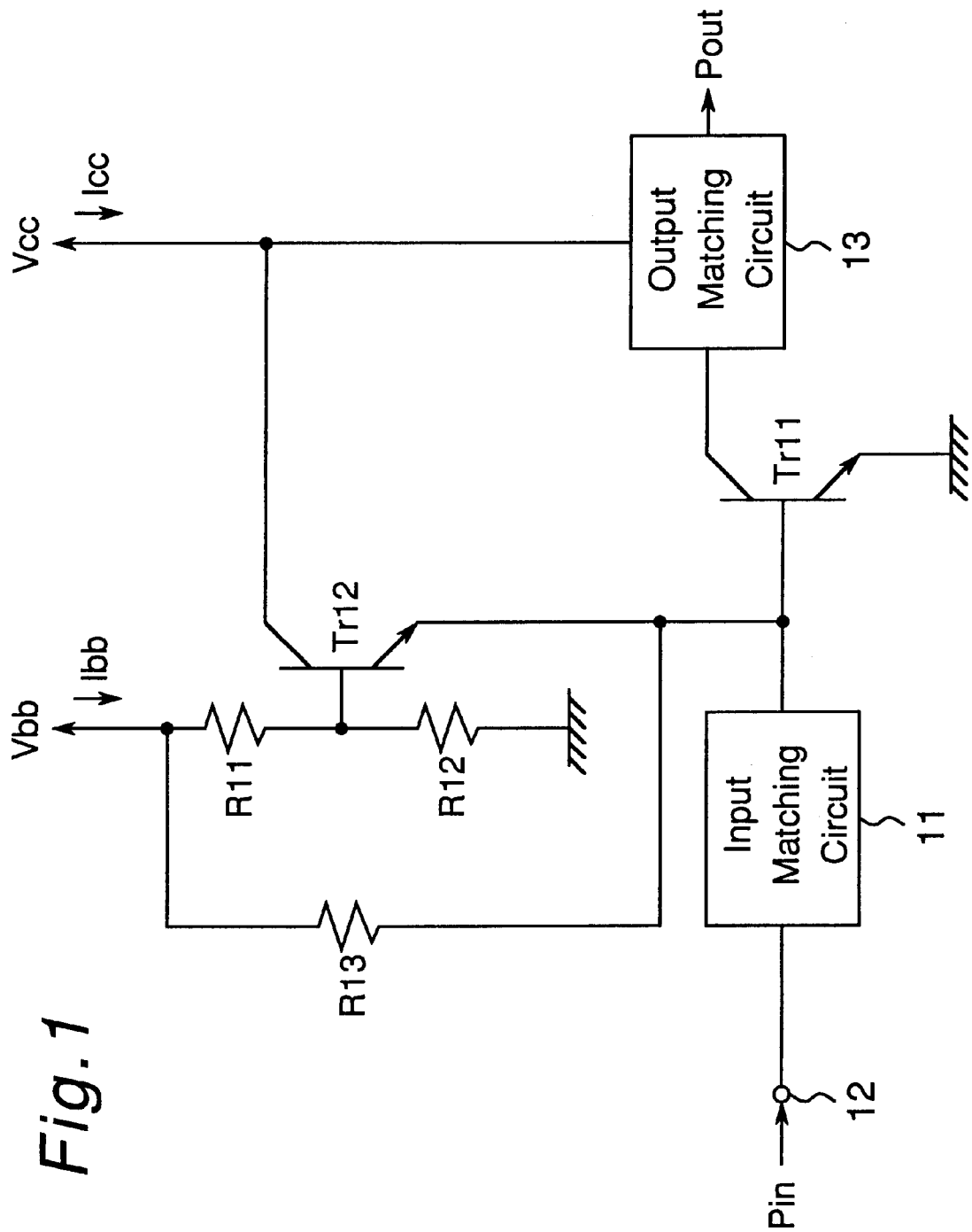
FIG. 1 is a circuit diagram of a first embodiment of the transistor power amplifier according to the present invention.

FIG. 1 is a circuit diagram of a transistor power amplifier according to the present: embodiment.

This transistor power amplifier is a common-emitter type power amplifier employing bipolar transistors. In the figure, a reference symbol Tr11 denotes a power amplifying bipolar transistor (referred to as "power amplifying transistor" hereinafter) constructed of a silicon NPN-type bipolar transistor or a GaAs HBT. A reference symbol Tr12 denotes a base current driving bipolar transistor (referred to as "base driving transistor" hereinafter) which drives the base of the power amplifying transistor Tr11 and is constructed of a silicon NPN-type bipolar transistor or a GaAs HBT.

The power amplifying transistor Tr11 has its emitter grounded and its base connected to the emitter of the base driving transistor Tr12. The base of the base driving transistor Tr12 is connected between base voltage adjusting bias resistors R11 and R12 that are connected in series. The bias resistor R11 is connected to a gain control power source Vbb for controlling the gain of the present power amplifier, while the bias resistor R12 is grounded. Further, the collector of the base driving transistor Tr12 is connected to a collector power source Vcc.

The base of the power amplifying transistor Tr11 is connected to an input matching circuit 11 which serves as the aforementioned impedance matching circuit, and an input signal Pin at a signal input terminal 12 is supplied to the input matching circuit 11. Further, the base of the power amplifying transistor Tr11 is connected to the gain control power source Vbb via a bias resistor R13. Further, the collector of the power amplifying transistor Tr11 is connected to the collector power source Vcc via an output matching circuit 13. Then, an amplified signal from the collector of the power amplifying transistor Tr11 is outputted as an output signal Pout via the output matching circuit 13.

The output matching circuit 13 includes a collector bias circuit.

Figure 2:
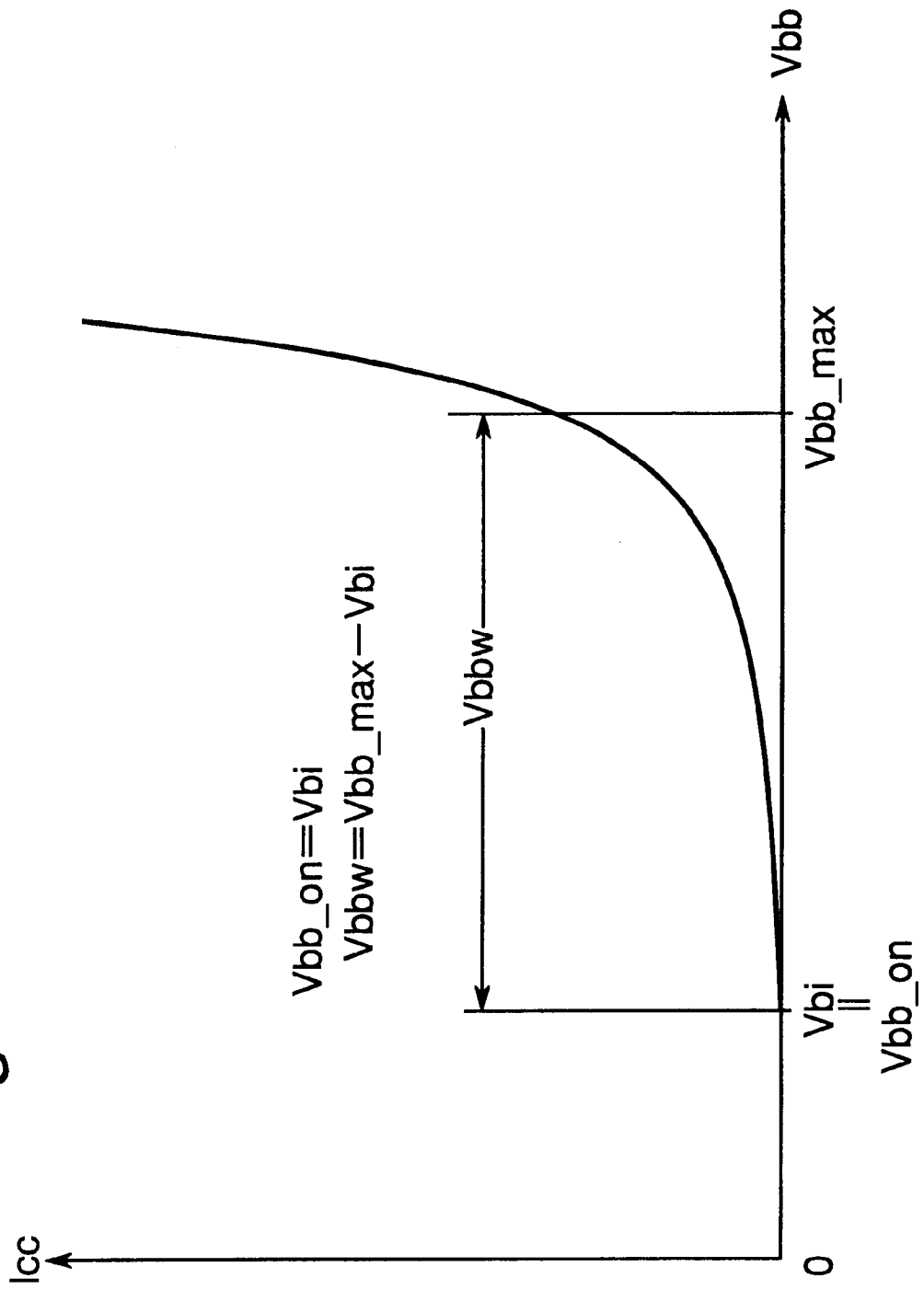
FIG. 2 is a graph showing a relation between a collector current Icc and a gain control voltage Vbb in the transistor power amplifier shown in FIG. 1.

FIG. 2 shows a relation between the collector current Icc and the gain control voltage Vbb in the transistor power amplifier shown in FIG. 1.

In the present embodiment, the power amplifying transistor Tr11 is directly biased by the gain control power source Vbb via the bias resistor R13. Therefore, assuming that the ON-state voltage across the base and the emitter of the bipolar transistor is Vbi, then the ON-state voltage (amplifier ON-state voltage) Vbb_on of the power amplifying transistor Tr11 viewed from the terminal of the gain control power source Vbb is:

$$Vbb\_on = Vbi$$

The power amplifying transistor Tr11 is not turned on until the amplifier ON-state voltage Vbb_on is reached. Therefore, assuming that the maximum value of the gain control voltage Vbb is Vbb_max, the effective voltage (effective gain control voltage) Vbbw capable of controlling the gain is:

$$Vbbw = Vbb\_max - Vbb\_on$$
$$= Vbb\_max - Vbi$$

Figure 8:
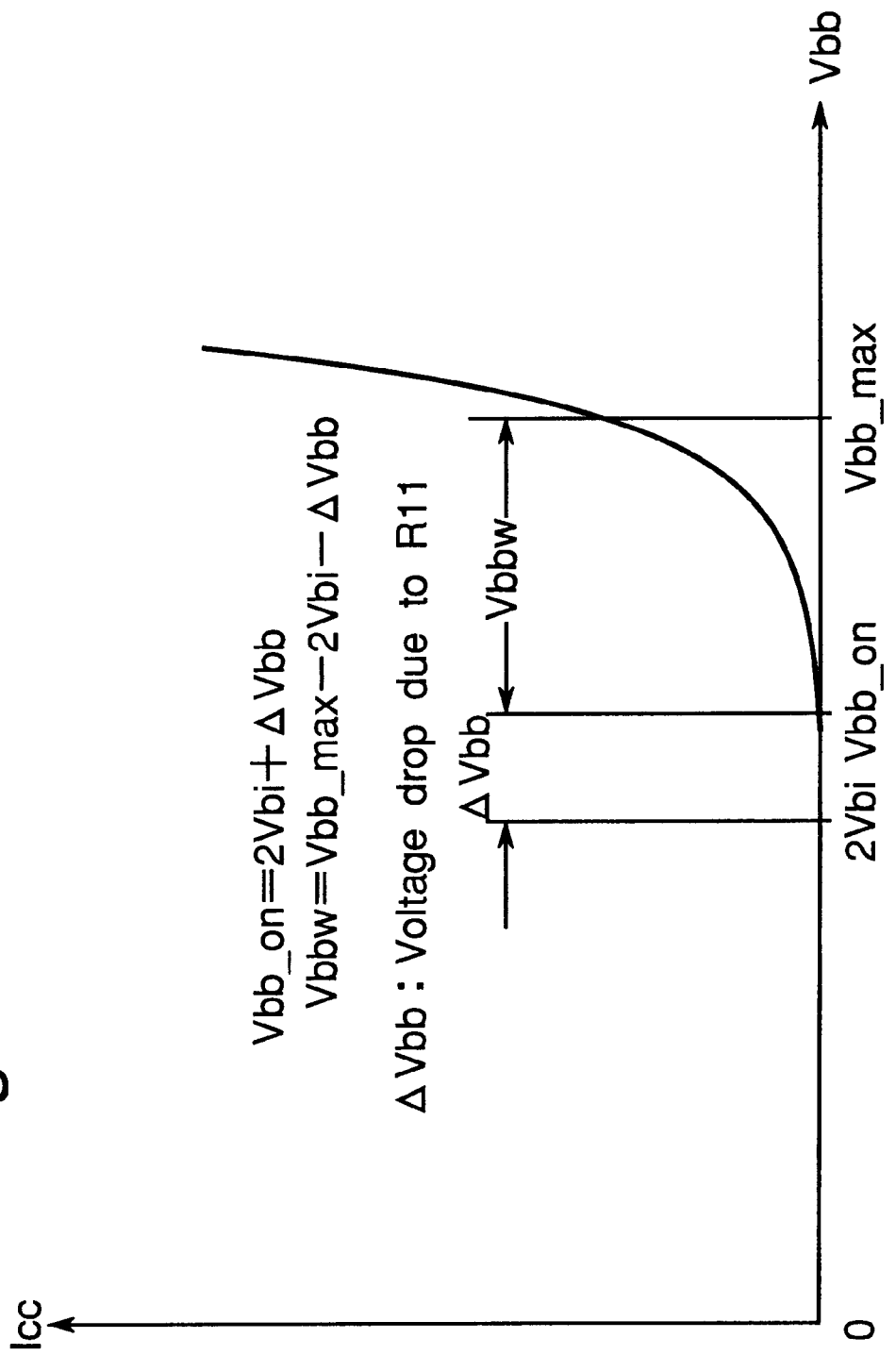
FIG. 8 is a graph showing a relation between a collector current Icc and a gain control voltage Vbb in the prior art power amplifier shown in FIG. 7.

That means that the effective gain control voltage in the present embodiment is greater than the effective gain control voltage Vbbw in the prior art power amplifier shown in FIG. 8 by the ON-state voltage Vbi of the base driving transistor Tr12.

Assume that the battery power voltage is 4.8 V provided by a series connection of four cells of the nickel-hydrogen battery. Also, assume that the maximum gain control voltage Vbb_max is allowed to have an upper limit of 4.8 V. Then, since the ON-state voltage of the silicon bipolar transistor is 0.7 V and the ON-state voltage Vbi of the GaAs HBT is 1.3 V as described above, the maximum value of the effective gain control voltage Vbbw is 4.1 V in the case of the silicon bipolar transistor and 3.5 V in the case of the GaAs HBT.

Figure 7:
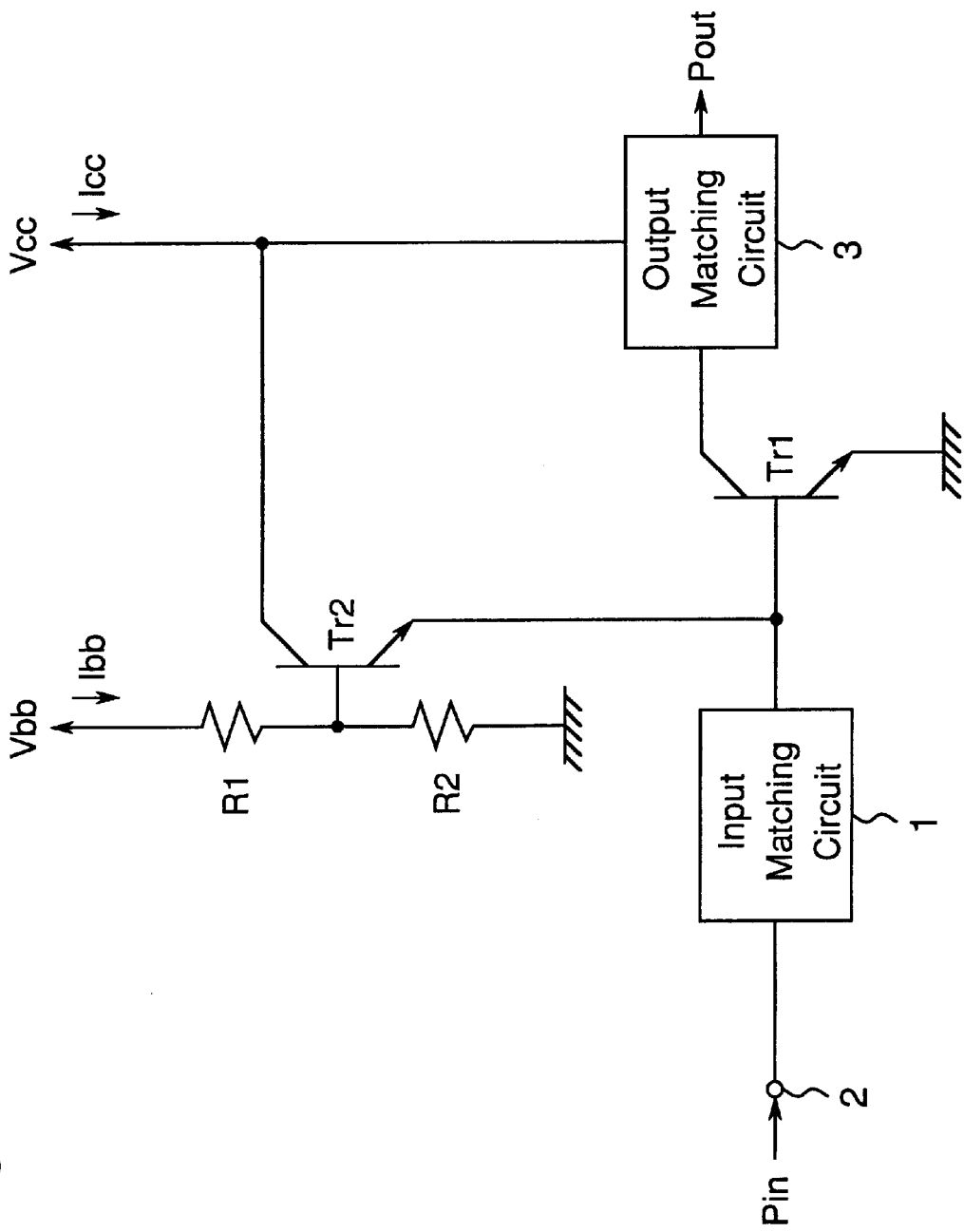
FIG. 7 is a circuit diagram of a prior art common-emitter type power amplifier.

That is, as compared with the prior art power amplifier shown in FIG. 7 wherein the maximum value of the effective gain control voltage Vbbw when the battery power voltage is 4.8 V is Vbbw=3.4 V in the case of the silicon bipolar transistor and Vbbw=2.2 V in the case of the GaAs HBT as described above, the effective gain control voltage range is expanded by about 20% in the case of the silicon bipolar transistor and about 60% in the case of the GaAs HBT according to the present embodiment.

Next, a consideration is given to the case where the battery power voltage is 3.6 V provided by a series connection of three cells of the nickel-hydrogen battery or by one cell of the lithium ion battery.

Supposing that the maximum gain control voltage Vbb_max is allowed to have an upper limit of 3.6 V, the maximum value of the effective gain control voltage Vbbw is Vbbw=2.9 V in the case of the silicon bipolar transistor and Vbbw=2.3 V in the case of the GaAs HBT.

In this case, as compared with the prior art power amplifier wherein the maximum value of the effective gain control voltage Vbbw when the battery power voltage is 3.6 V is Vbbw=2.2 V in the case of the silicon bipolar transistor and Vbbw=1.0 V in the case of the GaAs HBT, the effective gain control voltage range is expanded by about 30% in the case of the silicon bipolar transistor and 130% in the case of the GaAs HBT according to the present embodiment.

Because the rate of increase of the effective gain control voltage range of the present embodiment with respect to that of the prior art power amplifier is greater in the case where the battery power voltage is 3.6 V than in the case where the battery power voltage is 4.8 V, it can be said that the present embodiment can produce a greater effect in the case where the battery power voltage is low than in the case where the battery power voltage is high.

Furthermore, since the rate of increase of the effective gain control voltage range of the present embodiment with respect to the prior art power amplifier is greater in the case of the GaAs HBT than in the case of the silicon bipolar transistor, it can be said that the present embodiment can produce a greater effect when the GaAs HBT having a high ON-state voltage Vbi across the base and the emitter is used as the amplifying element.

Furthermore, the rate of reduction of the effective gain control voltage Vbbw when the battery power voltage is reduced from 4.8 V to 3.6 V in the present embodiment is 70% in the case of the silicon bipolar transistor and 66% in the case of the GaAs HBT. Both of these values approximately correspond to the rate of reduction of 75% of the power voltage from 4.8 V to 3.6 V. This indicates that in the present embodiment there occurs no extreme reduction of the effective gain control voltage range due to the reduction of the battery power voltage.

When the gain control voltage Vbb is higher than the amplifier ON-state voltage Vbb_on (=Vbi: ON-state voltage across the base and the emitter of the base driving transistor Tr12), the base driving transistor Tr12 can be turned on to supply a base current to the power amplifying transistor Tr11. Therefore, a base current to be supplied by the bias resistor R13 to the power amplifying transistor Tr11 is allowed to be an auxiliary current supplied until the base current is supplied from the base driving transistor Tr12 to the power amplifying transistor Tr11. Therefore, the current to be flowed through the bias resistor R13 is allowed to be a small current, and the gain control current Ibb in the present embodiment is allowed to be a current smaller than at least a gain control current Ibb in the case where the base driving transistor Tr12 is not provided.

For example, in the case where the battery power voltage is 4.8 V, the maximum output power (i.e., output power obtained when the gain control voltage Vbb is the maximum gain control voltage Vbb_max) is 3 W (34.8 dBm), the power-added efficiency is 50%, the average collector current of the power amplifying transistor Tr11 is 1.25 A and the current amplification factor of the power amplifying transistor Tr11 is 10, and assuming that the operation gain for the maximum gain control voltage Vbb_max is 10 dB and that the input-output isolation when the power amplifying transistor Tr11 is off is –20 dB, then the gain control range of the present transistor power amplifier is 30 dB.

The gain control is normally executed in units of decibels. If it is intended that 15 dB of the 30 dB gain control range is supplied by the base current drive of the power amplifying transistor Tr11 via the bias resistor R13, then the bias resistor R13 is required to be responsible for up to 100 mW. Therefore, assuming that the power-added efficiency is reduced to as low as 5%, the current to be flowed through the bias resistor R13 is allowed to be only 40 mA, and if a current of 12.5 mA for driving the base of the base driving transistor Tr12 is added (refer to the "BACKGROUND OF THE INVENTION" section), the gain control current Ibb becomes only about 50 mA.

That is, the gain control current Ibb in the present embodiment is allowed to be less than a half of the gain control current Ibb of 125 mA required when the base driving transistor Tr12 is not incorporated (refer to the "BACKGROUND OF THE INVENTION" section).

As described above, according to the above embodiment, the base of the power amplifying transistor Tr11 is connected to the gain control power source Vbb via the bias resistor R13, so that the power amplifying transistor Tr11 is directly biased by the gain control power source Vbb via the bias resistor R13 until the base driving transistor Tr12 is turned on. Therefore, the range of the effective gain control voltage Vbbw in the present transistor power amplifier is expanded by an amount corresponding to the ON-state voltage Vbi across the base and the emitter of the base driving transistor Tr12.

The effect is great particularly in the case of the GaAs HBT having the excellent high-frequency characteristic in the low collector voltage operation stage, allowing the battery power voltage in mobile communication portable remote terminals to be reduced. This contributes to the size and weight reduction of such portable remote terminals.

Figure 3:
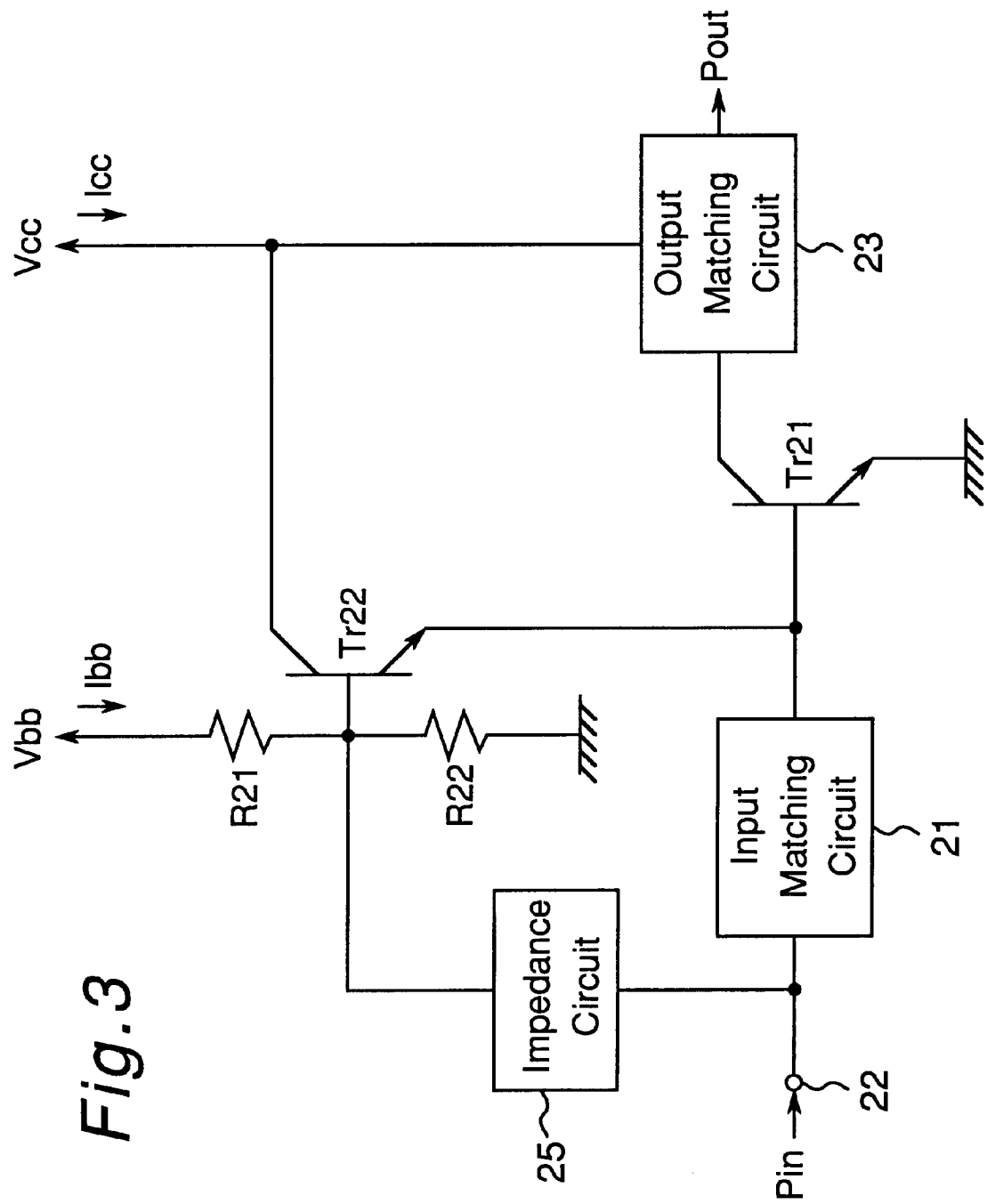
FIG. 3 is a circuit diagram of a second embodiment of the transistor power amplifier of the present invention.

FIG. 3 is a circuit diagram of a transistor power amplifier of a second embodiment.

A power amplifying transistor Tr21, a base driving transistor Tr22, base voltage adjusting bias resistors R21 and R22, an input matching circuit 21, a signal input terminal 22, an output matching circuit 23, a collector power source Vcc and a gain control power source Vbb have the same constructions as those of the power amplifying transistor Tr11, base driving transistor Tr12, base voltage adjusting bias resistors R11 and R12, input matching circuit 11, signal input terminal 12, output matching circuit 13, collector power source Vcc and gain control power source Vbb of the first embodiment shown in FIG. 1.

In the present embodiment, the signal input terminal 22 is connected with the base of the base driving transistor Tr22 via an impedance circuit 25 through which only AC components are passed. The impedance of the impedance circuit 25 can be set to any value as desired by adjusting the real part and the imaginary part of the impedance. Therefore, by virtue of this impedance circuit 25, the phases of the AC emitter potential and the AC base potential of the base driving transistor Tr22 can be made consistent.

Thus, by connecting the signal input terminal 22 to the base of the base driving transistor Tr22 such that only AC components are supplied to the base, thereby the signal at the transistor Tr22 base and the signal at the transistor Tr22 emitter being in phase, even when the emitter potential of the base driving transistor Tr22 is increased by the signal Pin supplied from the signal input terminal 22, the possible occurrence of the reduction of the voltage across the base and the emitter of the base driving transistor Tr22 is avoided by the increase of the base potential occurring simultaneously.

As a result, the base driving transistor Tr22 operates properly, and the deterioration of ability of the base driving transistor Tr22 to drive the base of the power amplifying transistor Tr21 is suppressed.

Therefore, according to the present embodiment, the gain reduction of the power amplifying transistor Tr21 attributed to the existence of the ON-state voltage Vbi across the base and the emitter of the power amplifying transistor Tr21 is prevented from occurring, so that the power of the output signal Pout is increased.

As described above, according to the present embodiment, the ability of the base driving transistor Tr22 for driving the base of the power amplifying transistor Tr21 is compensated for regardless of the value of the gain control voltage Vbb and the value of the amplifier ON-state voltage Vbb_on. Therefore, a high gain and a high output voltage are obtainable even when the battery power voltage is shifted from 4.8 V to 3.6 V and consequently the maximum gain control voltage Vbb_max becomes 2.2 V, which value is lower than the amplifier ON-state voltage Vbb_on (2.6 V) for the case where the GaAs HBT is used as the amplifying element, resulting in the class C operating mode.

That is, it can be said that the present embodiment produces a greater effect when using as an amplifying element the GaAs HBT which provides a high amplifier ON-state voltage Vbb_on of the power amplifying transistor Tr21 viewed from the terminal of the gain control power source Vbb and which tends to cause the operating mode to enter into the class C.

Figure 4:
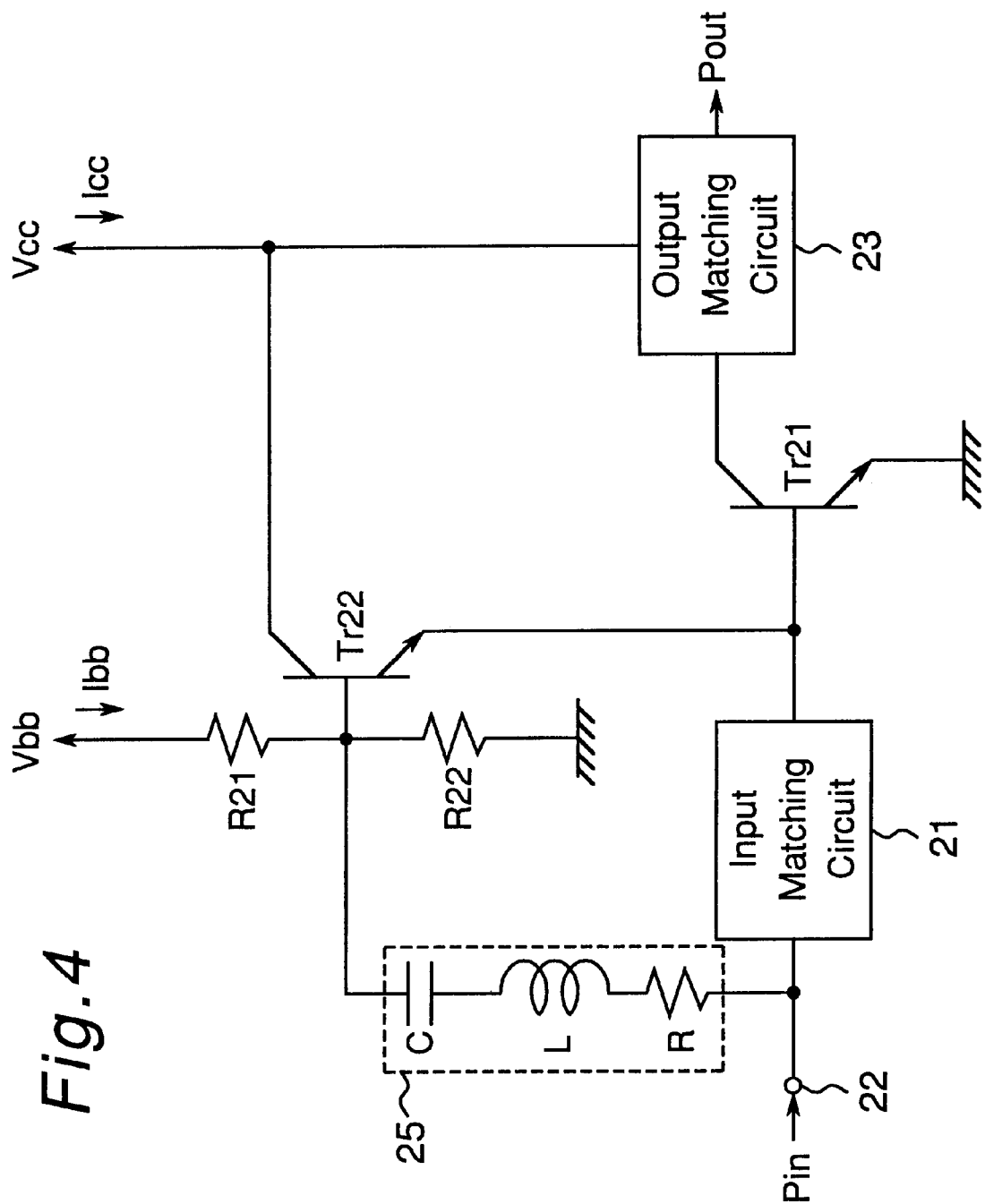
FIG. 4 is a circuit diagram of the second embodiment concretely disclosing the impedance circuit shown in FIG. 3.

FIG. 4 is a circuit diagram which concretely discloses the impedance circuit 25. This impedance circuit 25 is constructed by connecting a resistor R, an inductor L and a capacitor C in series, where an arbitrary impedance is achieved by selecting values of the resistor R, inductor L and capacitor C to be combined.

As described above, according to the present embodiment, the base of the base driving transistor Tr22 and the signal input terminal 22 are connected to each other via the impedance circuit 25 so that the phase of the AC emitter potential and the phase of the AC base potential of the base driving transistor Tr22 are made consistent. Therefore, the emitter potential and the base potential of the base driving transistor Tr22 are simultaneously increased by the input signal Pin, so that the reduction of the voltage across the base and the emitter of the base driving transistor Tr22 due to the input signal Pin can be avoided.

That is, according to the present embodiment, the deterioration of ability of the base driving transistor Tr22 to drive the base of the power amplifying transistor Tr21 is suppressed regardless of the gain control voltage Vbb and the amplifier ON-state voltage Vbb_on, so that the gain reduction of the power amplifying transistor Tr21 is prevented.

The effect is great particularly in the case of the GaAs HBT having the excellent high-frequency characteristic in the low collector voltage operation stage, allowing the battery power voltage in mobile communication portable remote terminals to be reduced. This contributes to the size and weight reduction of such portable remote terminals.

As described above, the impedance circuit 25 allows the phase of the alternating emitter potential relative to that of the alternating base potential of the base driving transistor Tr22 to be arbitrarily set. Therefore, the position of connection on the signal input terminal 22 side of the impedance circuit 25 can be placed at any point between the signal input terminal 22 and the base terminal of the power amplifying transistor Tr21.

Figure 5:
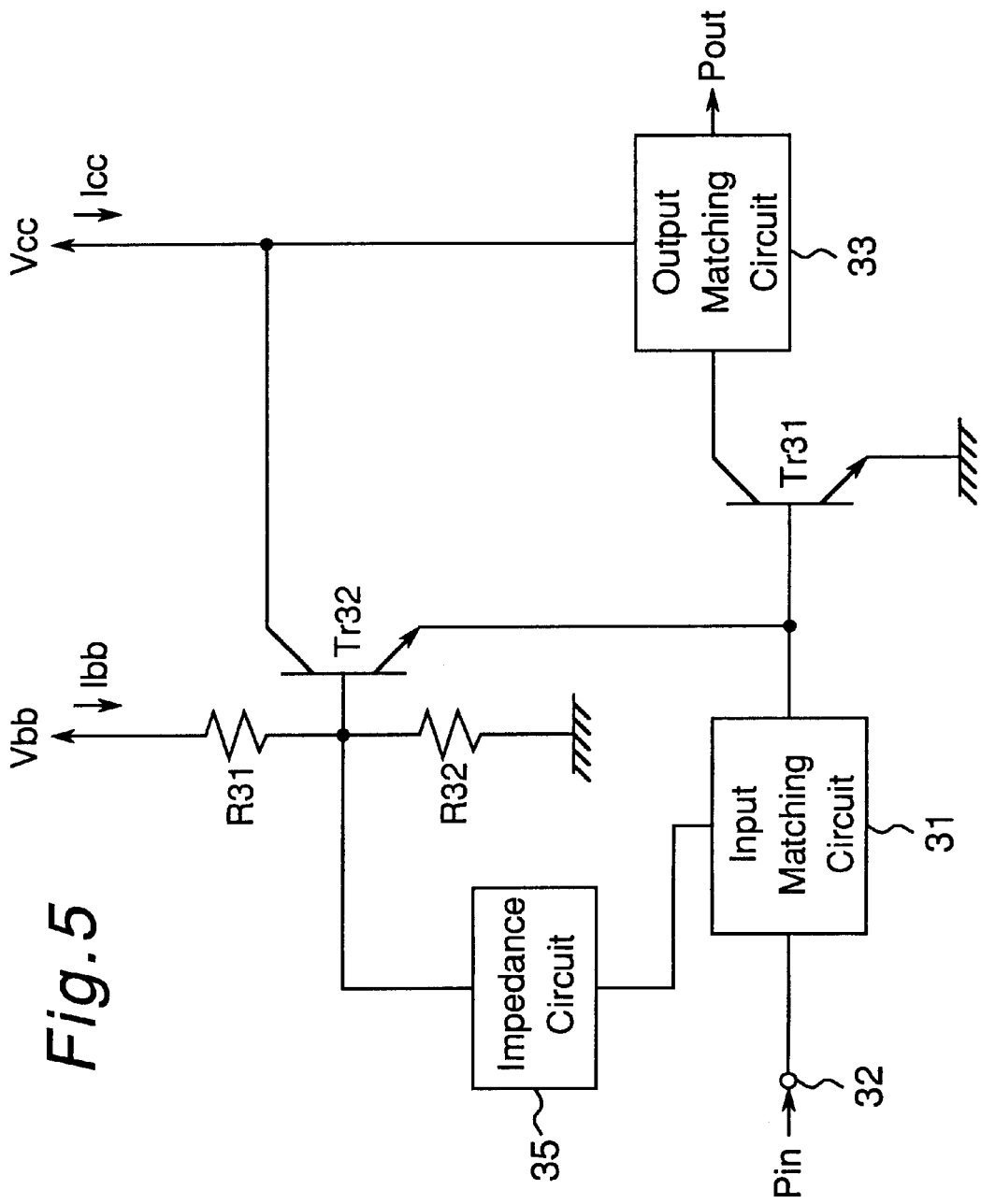
FIG. 5 is a circuit diagram of a third embodiment of the transistor power amplifier of the present invention.

In a transistor power amplifier shown in FIG. 5, an input matching circuit 31 is connected to the base of a base driving transistor Tr32 via an impedance circuit 35 through which only AC components are passed. It is to be noted that a power amplifying transistor Tr31, a base driving transistor Tr32, base voltage adjusting bias resistors R31 and R32, a signal input terminal 32, an output matching circuit 33, a collector power source Vcc and a gain control power source Vbb shown in FIG. 5 have the same constructions as those of the power amplifying transistor Tr21, base driving transistor Tr22, base voltage adjusting bias resistors R21 and R22, signal input terminal 22, output matching circuit 23, collector power source Vcc and gain control power source Vbb of the second embodiment shown in FIG. 3.

Also in the present embodiment, by arbitrarily setting the impedance of the impedance circuit 35, the phase of the AC emitter potential of the base driving transistor Tr32 is allowed to be consistent with the phase of the AC base potential thereof. Therefore, the reduction of the voltage across the base and the emitter of the base driving transistor Tr32 due to the input signal Pin is avoided regardless of the gain control voltage Vbb and the amplifier ON-state voltage Vbb_on, so that the reduction of the ability of the base driving transistor Tr32 to drive the base of the power amplifying transistor Tr31 is suppressed.

That is, according to the present embodiment, the gain reduction of the power amplifying transistor Tr31 is prevented even in the low voltage operation stage, thereby allowing the power of the output signal Pout to be increased.

Figure 6:
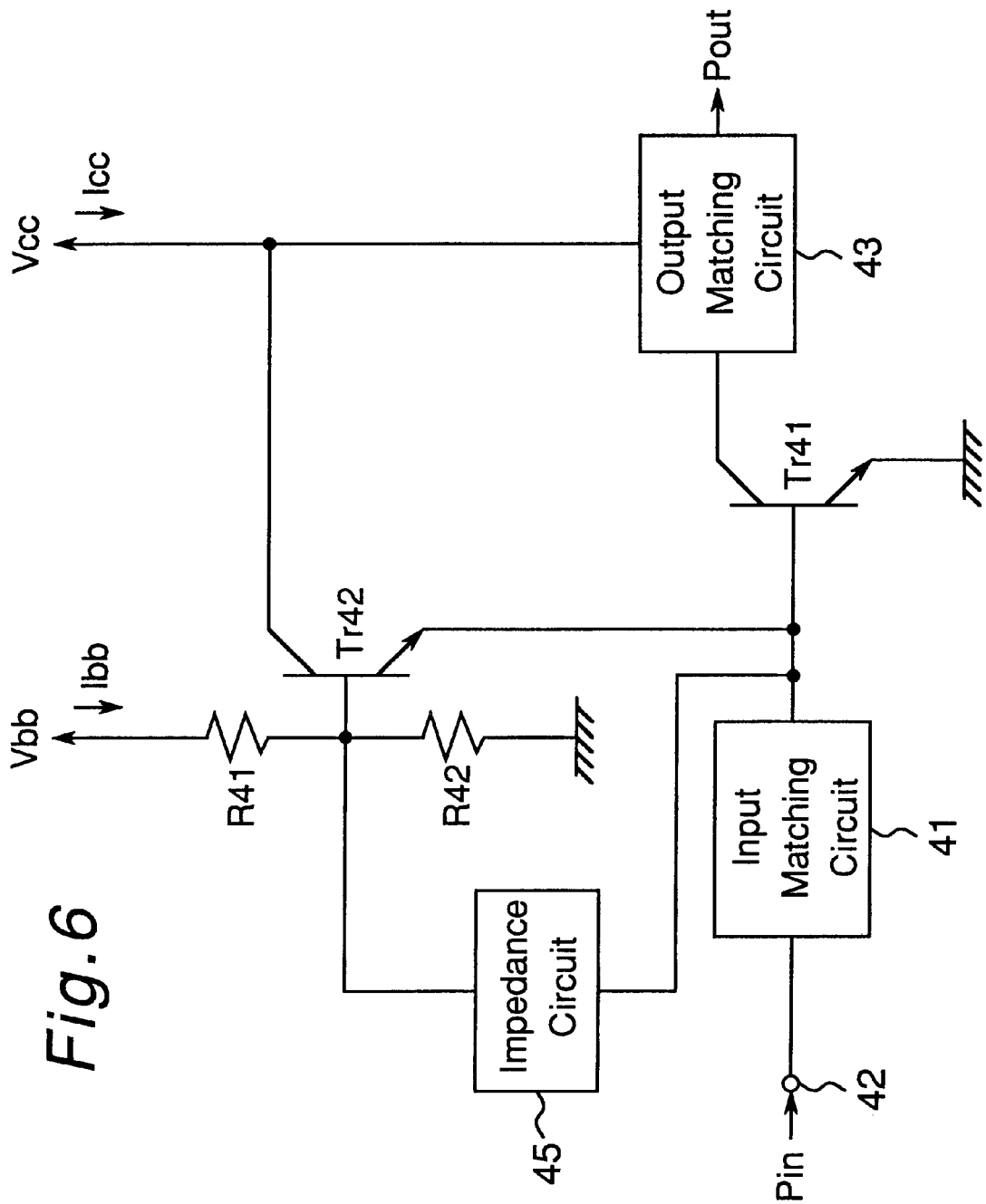
FIG. 6 is a circuit diagram of a fourth embodiment of the transistor power amplifier of the present invention.

In a transistor power amplifier shown in FIG. 6, the base of a base driving transistor Tr42 and the base of a power amplifying transistor Tr41 are connected to each other via an impedance circuit 45 through which only AC components are passed. It is to be noted that a power amplifying transistor Tr41, a base driving transistor Tr42, base voltage adjusting bias resistors R41 and R42, an input matching circuit 41, a signal input terminal 42, an output matching circuit 43, a collector power source Vcc and a gain control power source Vbb shown in FIG. 6 have the same constructions as those of the power amplifying transistor Tr21, base driving transistor Tr22, base voltage adjusting bias resistors R21 and R22, input matching circuit 21, signal input terminal 22, output matching circuit 23, collector power source Vcc and gain control power source Vbb of the second embodiment shown in FIG. 3.

Also in the present embodiment, by arbitrarily setting the impedance of the impedance circuit 45, the phases of the emitter AC potential and the base AC potential of the base driving transistor Tr42 are allowed to be consistent with each other. Therefore, the reduction of the voltage across the base and the emitter of the base driving transistor Tr42 due to the input signal Pin can be avoided regardless of the gain control voltage Vbb and the amplifier ON-state voltage Vbb__on, so that the deterioration of the ability of the base driving transistor Tr42 for driving the base of the power amplifying transistor Tr41 is suppressed.

That is, according to the present embodiment, the gain reduction of the power amplifying transistor Tr41 is prevented even in the low voltage operation stage, thereby allowing the power of the output signal to be increased.

In the second through fourth embodiments, the transistors practically have reactive components such as a junction capacitance and parasitic inductance. Therefore, the emitter potential and base potential of each of the base driving transistors Tr22, Tr32 and Tr42 are put out of phase. However, the relative deviation between the emitter and base potentials is adjustable by adjusting the impedance of each of the impedance circuits 25, 35 and 45.

It is a matter of course that the impedance circuits 35 and 45 in the third and fourth embodiments can be constructed by connecting the resistor R, the inductor L and the capacitor C in series as in the impedance circuit 25 shown in FIG. 4. Furthermore, the impedance circuits 25, 35 and 45 are not always required to be an R-L-C series circuit, but required only to have a circuit construction wherein the impedance is allowed to be set to an arbitrary value.

Furthermore, although the collector power source of the power amplifying transistors Tr11, Tr21, Tr31 and Tr41 and the collector power source of the base driving transistors Tr12, Tr22, Tr32 and Tr42 are commonly provided by the collector power source Vcc in the aforementioned embodiments, they can be provided by different power sources.

Furthermore, the above has described the arrangement of directly biasing the power amplifying transistor Tr11 from the gain control power source Vbb by connecting the base of the power amplifying transistor Tr11 to the gain control power source Vbb via the bias resistor R13 and the arrangement of putting the emitter potential and the base potential of the base driving transistor in phase by connecting the base of the base driving transistor to the signal input terminal, the base of the power amplifying transistor or the inside of the input matching circuit via the impedance circuit as different embodiments. However, it is acceptable to concurrently provide both the arrangements, i.e., combine the arrangement shown in FIG. 1 with the arrangement shown in FIG. 3, FIG. 5 or FIG. 6, thereby concurrently attempting both expanding the effective gain control voltage range and preventing the deterioration of the ability of the base driving transistor to drive the base of the power amplifying transistor.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A transistor power amplifier comprising:
    a first transistor, which is constructed of a bipolar transistor and which has an emitter grounded and a collector connected with a collector drive power source, for amplifying a signal supplied to a base thereof to output the amplified signal from the collector;
    a second transistor which is constructed of a bipolar transistor and which has an emitter connected with the base of the first transistor, a collector connected with the collector drive power source, and a base connected with a gain control power source; and
    a resistor connected with the gain control power source and the base of the first transistor, such that the base of the first transistor is biased by a dc output voltage of the gain control power source via the resistor.

2. The transistor power amplifier as claimed in claim 1, wherein the gain control power source has a voltage that is equal to or smaller than a sum of an ON-state voltage across the base and the emitter of the first transistor and an ON-state voltage across the base and the emitter of the second transistor.

3. The transistor power amplifier as claimed in claim 1, wherein each bipolar transistor is a gallium arsenide compound semiconductor hetero-junction bipolar transistor.

4. A transistor power amplifier comprising:
    a first transistor, which is constructed of a bipolar transistor and which has an emitter grounded and a collector connected with a collector drive power source, for amplifying a signal supplied to a base thereof to output the amplified signal from the collector;
    a second transistor for driving the base of the first transistor, the second transistor is constructed of a bipolar transistor and has an emitter connected with the base of the first transistor, a collector connected with the collector drive power source, and a base connected with a gain control power source; and
    a signal input terminal for supplying a signal to the base of the first transistor; and
    an impedance circuit for connecting the base of the second transistor with the signal input terminal, the impedance circuit changing a base potential of the second transistor, in phase with an emitter potential of the second transistor changed by an input signal.

5. The transistor power amplifier as claimed in claim 4, wherein each bipolar transistor is a gallium arsenide compound semiconductor hetero-junction bipolar transistor.

6. A transistor power amplifier comprising:
    a first transistor, which is constructed of a bipolar transistor and which has an emitter grounded and a collector connected with a collector drive power source, for amplifying a signal supplied to a base thereof to output the amplified signal from the collector;
    a second transistor for driving the base of the first transistor, the second transistor is constructed of a bipolar transistor and has an emitter connected with the base of the first transistor, a collector connected with the collector drive power source, and a base connected with a gain control power source; and
    an impedance circuit for connecting the base of the second transistor with the base of the first transistor, wherein the impedance circuit changes a base potential of the second transistor, in phase with an emitter potential of the second transistor changed by an input signal.

7. The transistor power amplifier as claimed in claim 6, wherein each bipolar transistor is a gallium arsenide compound semiconductor hetero-junction bipolar transistor.

8. A transistor power amplifier comprising:
    a first transistor, which is constructed of a bipolar transistor and which has an emitter grounded, a collector connected with a collector drive power source, and a base connected to an impedance matching circuit, for amplifying a signal supplied to the base via the impedance matching circuit to output the amplified signal from the collector;

a second transistor for driving the base of the first transistor, the second transistor is constructed of a bipolar transistor and has an emitter connected with the base of the first transistor, a collector connected with the collector drive power source, and a base connected with a gain control power source; and an impedance circuit for connecting the base of the second transistor with the impedance matching circuit, wherein the impedance circuit changes a base potential of the second transistor, in phase with an emitter potential of the second transistor changed by an input signal.

9. The transistor power amplifier as claimed in claim 8, wherein each bipolar transistor is a gallium arsenide compound semiconductor hetero-junction bipolar transistor.

10. The transistor power amplifier as claimed in claim 4, wherein the impedance circuit connects the signal input terminal with the base of the second transistor such that only AC components are supplied to the base of the second transistor.

11. The transistor power amplifier as claimed in claim 6, wherein the impedance circuit connects the base of the first transistor with the base of the second transistor such that only AC components are supplied to the base of the second transistor.

12. The transistor power amplifier as claimed in claim 8, wherein the impedance circuit connects the impedance matching circuit with the base of the second transistor such that only AC components are supplied to the base of the second transistor.

* * * * *

UNITED STATES PATENT AND TRADEMARK OFFICE
CERTIFICATE OF CORRECTION

PATENT NO. : 6,121,841
DATED : September 19, 2000
INVENTOR(S) : Keiichi Sakuno

It is certified that error appears in the above-identified patent and that said Letters Patent is hereby corrected as shown below:

In Category [56], please add the following section:

--OTHER PUBLICATIONS
Sakuno et al., "A 3.5W HBT MMIC Power Amplifier Module for Mobile Communications", 1994; pages 63-66--.

Signed and Sealed this

Twenty-sixth Day of June, 2001

Attest:

*Nicholas P. Godici*

NICHOLAS P. GODICI
*Attesting Officer*   *Acting Director of the United States Patent and Trademark Office*